United States Patent
Takanashi et al.

(10) Patent No.: US 10,424,491 B2
(45) Date of Patent: Sep. 24, 2019

(54) ETCHING METHOD

(71) Applicant: Tokyo Electron Limited, Tokyo (JP)

(72) Inventors: Yuki Takanashi, Miyagi (JP); Noriaki Oikawa, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/770,264

(22) PCT Filed: Nov. 15, 2016

(86) PCT No.: PCT/JP2016/083832
§ 371 (c)(1),
(2) Date: Apr. 23, 2018

(87) PCT Pub. No.: WO2017/090486
PCT Pub. Date: Jun. 1, 2017

(65) Prior Publication Data
US 2018/0323077 A1    Nov. 8, 2018

(30) Foreign Application Priority Data

Nov. 26, 2015  (JP) ................................. 2015-230606

(51) Int. Cl.
| | |
|---|---|
| *H01L 21/311* | (2006.01) |
| *G03F 7/40* | (2006.01) |
| *H01L 21/033* | (2006.01) |
| *H01L 21/4763* | (2006.01) |
| *H01L 21/768* | (2006.01) |
| *G03F 7/00* | (2006.01) |
| *B81C 1/00* | (2006.01) |

(52) U.S. Cl.
CPC ...... *H01L 21/31144* (2013.01); *G03F 7/0002* (2013.01); *G03F 7/40* (2013.01); *H01L 21/0337* (2013.01); *H01L 21/31138* (2013.01); *H01L 21/4763* (2013.01); *H01L 21/76816* (2013.01); *B81C 1/00031* (2013.01)

(58) Field of Classification Search
USPC .......................................................... 438/694
See application file for complete search history.

(56) References Cited

U.S. PATENT DOCUMENTS

2014/0370718 A1* 12/2014  Chakrapani ....... H01L 21/67103
                                                                  438/725

FOREIGN PATENT DOCUMENTS

| JP | 2004-168649 | 6/2004 |
|---|---|---|
| JP | 2007-208255 | 8/2007 |
| JP | 2010-269304 | 12/2010 |
| JP | 2012-204668 | 10/2012 |
| WO | 2015/046510 | 4/2015 |

\* cited by examiner

*Primary Examiner* — Roberts P Culbert
(74) *Attorney, Agent, or Firm* — IPUSA, PLLC

(57) ABSTRACT

An etching method for etching a silicon-containing layer into a pattern of a mask is provided. The mask is formed by etching, from a block copolymer layer that includes a first polymer and a second polymer, that is layered on the silicon-containing layer of an object to be processed via an intermediate layer, and that is enabled to be self-assembled, a second region including the second polymer and the intermediate layer right under the second region. The etching method includes generating plasma by supplying a process gas including carbon C, sulfur S, and fluorine F to the inside of a processing chamber of a plasma processing apparatus in which the object to be processed is provided; and forming a protective film on the mask and etching the silicon-containing layer according to the generated plasma.

5 Claims, 7 Drawing Sheets

ETCHING METHOD

BACKGROUND OF THE INVENTION

1. Field of the Invention

The present invention relates to an etching method.

2. Description of the Related Art

In order to realize further miniaturization of devices such as semiconductor devices, it is necessary to form a pattern with dimensions less than the critical dimension obtained by micro-fabrication using conventional photolithography techniques. As one of the methods for forming a pattern with the dimensions described above, a next generation exposure technique, EUV (extreme ultra violet), is being developed. In EUV, a light beam with a wavelength less than that of the conventional UV light source is used. For example, the light beam with a very short wavelength, 13.5 nm, is used. Because of the very short wavelength, there are problems related to EUV for mass production such as, for example, longer exposure time. Therefore, development of another production method is desired which is capable of providing further miniaturized devices.

A technique of forming a pattern by using a self-assembled block copolymer (BCP), which is one of the self-assembled materials that assemble an ordered pattern spontaneously, is attracting attention as a technique that will replace conventional lithography techniques (e.g., refer to Patent Document 1 and Patent Document 2).

In the technique described in Patent Document 1, a block copolymer layer is applied onto the foundation layer. The block copolymer layer includes a block copolymer having two or more immiscible polymeric block components A and B. Further, a thermal treatment (annealing) is carried out to effectuate spontaneous phase separation between the polymeric block components A and B. According to the above, an ordered pattern, in which a first region including the polymeric block component A and a second region including the polymeric block component B are included, is obtained.

Further, block copolymer (BCP) patterning is proposed as a method for forming a via in Patent Document 2. In the block copolymer patterning described in Patent Document 2, the pattern is obtained by removing the second region from the phase separated first region and the second region of the block copolymer layer.

CITATION LIST

Patent Document

[Patent Document 1] Japanese Unexamined Patent Application Publication No. 2007-208255
[Patent Document 2] Japanese Unexamined Patent Application Publication No. 2010-269304

SUMMARY OF THE INVENTION

Technical Problem

However, in the techniques described in Patent Document 1 and Patent Document 2, the plasma tolerance of a mask that is obtained by patterning of the block copolymer is low. As a result, there is a case in which kinks (non-uniformities, disturbances) (also referred to as "wiggling") of the mask pattern occur during the etching of a foundation layer such as a Si-ARC (silicon-containing anti-reflection film) or a SiON (silicon oxynitride film), and in which the roughness (unevenness generated on the wall surface of the pattern) of the etching pattern of the foundation layer is worsened. For example, the roughness of the etching pattern of the foundation layer is indicated by a LER (Line Edge roughness) value or a LWR (Line Width roughness) value of the pattern formed by the etching. In particular, the LER value becomes greater when the roughness of the etching pattern of the foundation layer is worsened.

With respect to the above, a method for improving the roughness can be considered in which an electron beam or a UV beam is emitted onto the mask, and in which the roughness of the etching pattern of the foundation layer is improved by the mask treatment using a supplied $H_2$ gas or an Ar gas. However, in the etching in which the mask is made of a pattern of a block copolymer whose components are different from the components of the conventional ArF mask, even if the mask treatment is performed under the same condition settings as the ArF mask, it is difficult to properly improve the roughness of the etching pattern of the foundation layer.

In view of one or more problems described above, an object of an aspect of the present invention is to improve the roughness of the etching pattern.

Solution to Problem

In order to solve the one or more problems described above, an etching method is provided according to an embodiment of the present invention. The etching method is a method for etching a silicon-containing layer into a pattern of a mask that is formed by etching, from a block copolymer layer that includes a first polymer and a second polymer, that is layered on the silicon-containing layer of an object to be processed via an intermediate layer, and that is enabled to be self-assembled, a second region including the second polymer and the intermediate layer right under the second region. The etching method includes generating plasma by supplying a process gas including carbon C, sulfur S, and fluorine F to the inside of a processing chamber of a plasma processing apparatus in which the object to be processed is provided; and forming a protective film on the mask and etching the silicon-containing layer according to the generated plasma.

Advantageous Effects of Invention

According to an aspect of the present invention, it is possible to improve the roughness of the etching pattern.

DETAILED DESCRIPTION OF THE PREFERRED EMBODIMENTS

Figure 1:
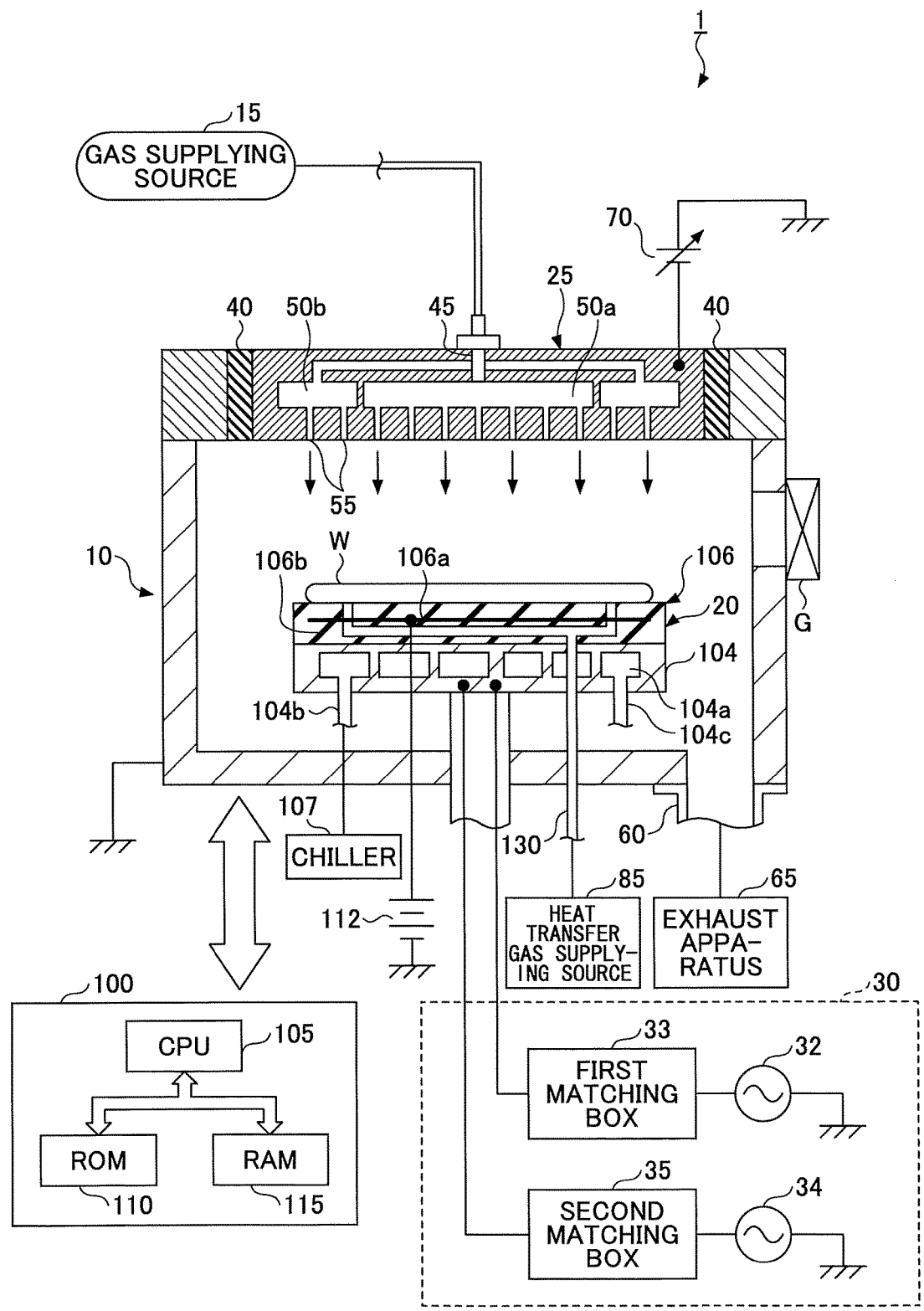
FIG. 1 is a schematic drawing illustrating an example of a plasma processing apparatus according to an embodiment of the present invention.

In the following, an embodiment of the present invention will be described while making reference to the drawings. It should be noted that, in the present specification and the drawings, a same reference numeral is given to substantially a same structure, and duplicated descriptions will be omitted.

[Plasma Processing Apparatus]

First, referring to FIG. 1, an example of a plasma processing apparatus 1 will be described. A plasma processing apparatus 1 according to an embodiment of the present invention is a capacitively-coupled parallel-plate-type plasma processing apparatus, and includes a processing chamber 10 having substantially a cylindrical shape. Alumite treatment (anodizing treatment) is applied to an inner surface of the processing chamber 10.

A susceptor 20 is provided in the bottom of the processing chamber 10, and a wafer W is placed on the susceptor 20. The wafer W is an example of an object to be processed. The susceptor 20 is made of, for example, aluminum (Al), titanium (Ti), silicon carbide (SiC), etc. On an upper surface of the susceptor 20, an electro-static chuck 106, to which the wafer W is electro-statically attracted, is provided. The electro-static chuck 106 has a structure in which a chuck electrode 106a is included in an insulator 106b. A DC voltage source 112 is connected to the chuck electrode 106a. The wafer W is attracted to the electro-static chuck 106 by Coulomb's force by applying a DC voltage HV to the chuck electrode 106a from the DC voltage source 112.

The susceptor 20 is supported by a support 104. A coolant flow path 104a is provided inside the support 104. The coolant flow path 104a is connected to a coolant entrance piping 104b and to a coolant exit piping 104c. A cooling medium (hereinafter, referred to as "coolant"), such as cooling water or brine, output from a chiller 107 is circulated in the coolant entrance piping 104b, the coolant flow path 104a, and the coolant exit piping 104c. The heat of the susceptor 20 and the electro-static chuck 106 is removed by the coolant, and the susceptor 20 and the electro-static chuck 106 are cooled.

A heat-transfer gas supplying source 85 causes a heat-transfer gas such as a helium gas (He), an argon gas (Ar), etc., to pass through a gas supplying line 130, and supplies the heat-transfer gas to the rear surface of the wafer W on the electro-static chuck 106. With the above arrangement, the temperature of the electro-static chuck 106 is controlled by the coolant that is circulated through the coolant flow paths 104a and by the heat-transfer gas supplied to the rear surface of the wafer W. As a result, it is possible to control the wafer W to be at a predetermined temperature.

A power supplying apparatus 30 for supplying dual-frequency superimposed power is connected to the susceptor 20. The power supplying apparatus 30 includes a first high-frequency power source 32 for supplying high-frequency power HF with first frequency used for plasma generation, and a second high-frequency power source 34 for supplying high-frequency power LF with second frequency that is lower than the first frequency used for bias voltage generation. The first high-frequency power source 32 is electrically connected to the susceptor 20 via a first matching box 33. The second high-frequency power source 34 is electrically connected to the susceptor 20 via a second matching box 35. The first high-frequency power source 32 applies, for example, 60 MHz high-frequency power HF to the susceptor 20. The second high-frequency power source 34 applies, for example, 12.56 MHz high-frequency power LF to the susceptor 20. It should be noted that, in an embodiment of the present invention, the first high-frequency power is applied to the susceptor 20. However, the first high-frequency power may be applied to a gas shower head 25.

An internal (or output) impedance of the first high-frequency power source 32 is matched to a load impedance by the first matching box 33. An internal (or output) impedance of the second high-frequency power source 34 is matched to a load impedance by the second matching box 35. The first matching box 33 functions in such a way that the internal impedance of the first high-frequency power source 32 appears to match the load impedance when plasma is being generated in the processing chamber 10. The second matching box 35 functions in such a way that the internal impedance of the second high-frequency power source 34 appears to match the load impedance when plasma is being generated in the processing chamber 10.

The gas shower head 25 is provided for closing an opening of the ceiling of the processing chamber 10 via a shield ring 40 that coats the outer edge of the gas shower head 25. The gas shower head 25 is connected to a variable DC power source 70, and a negative DC (DC voltage) is output from the variable DC power source 70 to the gas shower head 25. The gas shower head 25 is made of silicon.

In the gas shower head 25, a gas inlet 45 for introducing a gas is formed. Inside of the gas shower head 25, there are a diffusion room 50a in the center and a diffusion room 50b in the edge, that are branched from the gas inlet 45. A gas that is output from the gas supplying source 15 is supplied to the diffusion rooms 50a and 50b via the gas inlet 45. The supplied gas is diffused by the diffusion rooms 50a and 50b. The diffused gas is introduced towards the susceptor 20 from a number of gas supplying holes 55.

There is an exhaust port 60 in the bottom of the processing chamber 10. The gas in the processing chamber 10 is exhausted by an exhaust apparatus 65 that is connected to the exhaust port 60. With the above arrangement, it is possible to maintain the inside of the processing chamber 10 at a predetermined vacuum level. A gate valve G is provided on a side wall of the processing chamber 10. The gate valve G is used for opening and closing a loading/unloading opening when a wafer W is carried in and out of the processing chamber 10.

In the plasma processing apparatus 1, there is a control unit 100 used for controlling an overall operation of the apparatus. The control unit 100 includes a CPU (Central Processing Unit) 105, a ROM (Read Only Memory) 110, and a RAM (Random Access Memory) 115. The CPU 105 performs desired plasma processes such as an etching process according to various recipes stored in the storage areas described above. Apparatus control information, corresponding to process conditions such as etching conditions, is set in the recipes. The apparatus control information includes a process time, a process pressure (exhaust gas), high-frequency power and a voltage, various gas flow rates, temperatures in the processing chamber (upper electrode temperature, temperature of the side wall of the processing chamber, wafer W temperature, electro-static chuck temperature, etc.,), the temperature of a coolant output from the chiller 107. It should be noted that the above-described recipes that indicate program conditions and processing conditions may be stored in a hard disk or a semiconductor memory. Further, the recipes may be stored in a portable computer-readable recording medium, such as a CD-ROM, DVD, etc., and may be read from the recording medium that is set at a predetermined position.

In the etching process, the gate valve G is controlled to open and close, the wafer W is carried into the processing chamber 10, and the wafer W is placed on the susceptor 20. The wafer W is attracted to and retained by the electro-static chuck 106 by Coulomb's force by applying a DC voltage HV to the chuck electrode 106a from the DC voltage source 112.

Next, a desired process gas and high-frequency power are supplied to the inside of the processing chamber 10, and plasma is generated. Coating is applied to a mask MK according to the generated plasma, and plasma etching is applied to the wafer W. After the etching, static electricity of charges of the wafer W is eliminated by applying a DC voltage HV, whose electrical polarity is opposite to what has been applied when attracting the wafer W, to the chuck electrode 106a from the DC voltage source 112, and the wafer W is removed from the electro-static chuck 106. The gate valve G is controlled to open and close, and the wafer W is carried out of the processing chamber 10.

[Etching Method]

Figure 2:
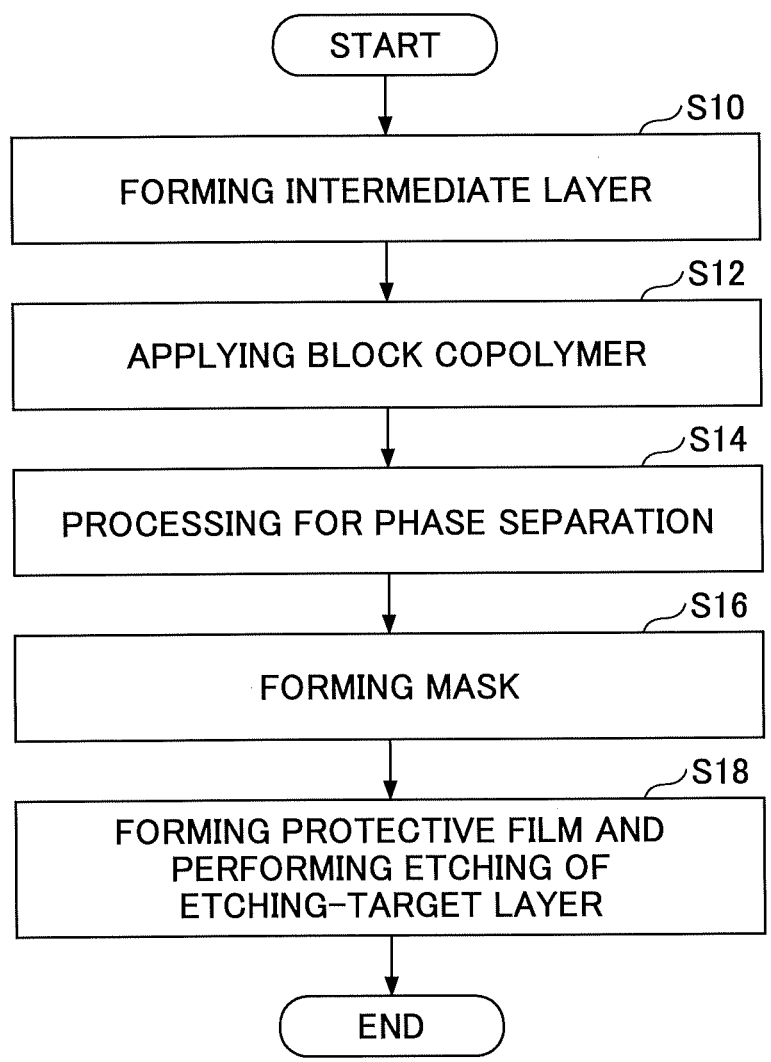
FIG. 2 is a flowchart illustrating an example of an etching method according to an embodiment of the present invention.
Figure 3:
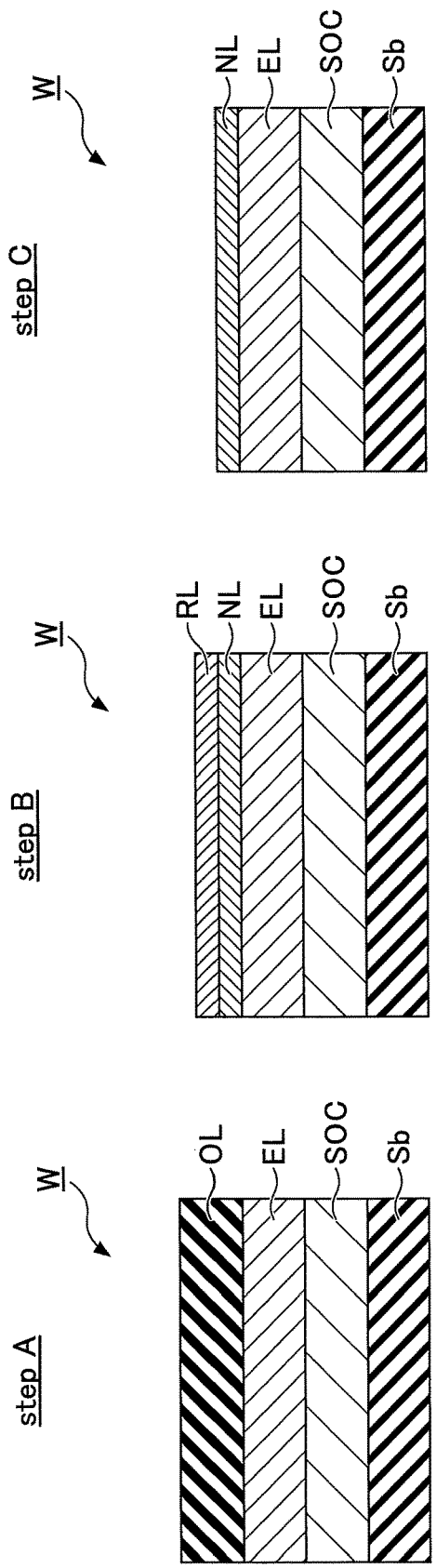
FIG. 3 is a drawing illustrating a cross section of a product produced at each step illustrated in FIG. 2.
Figure 4:
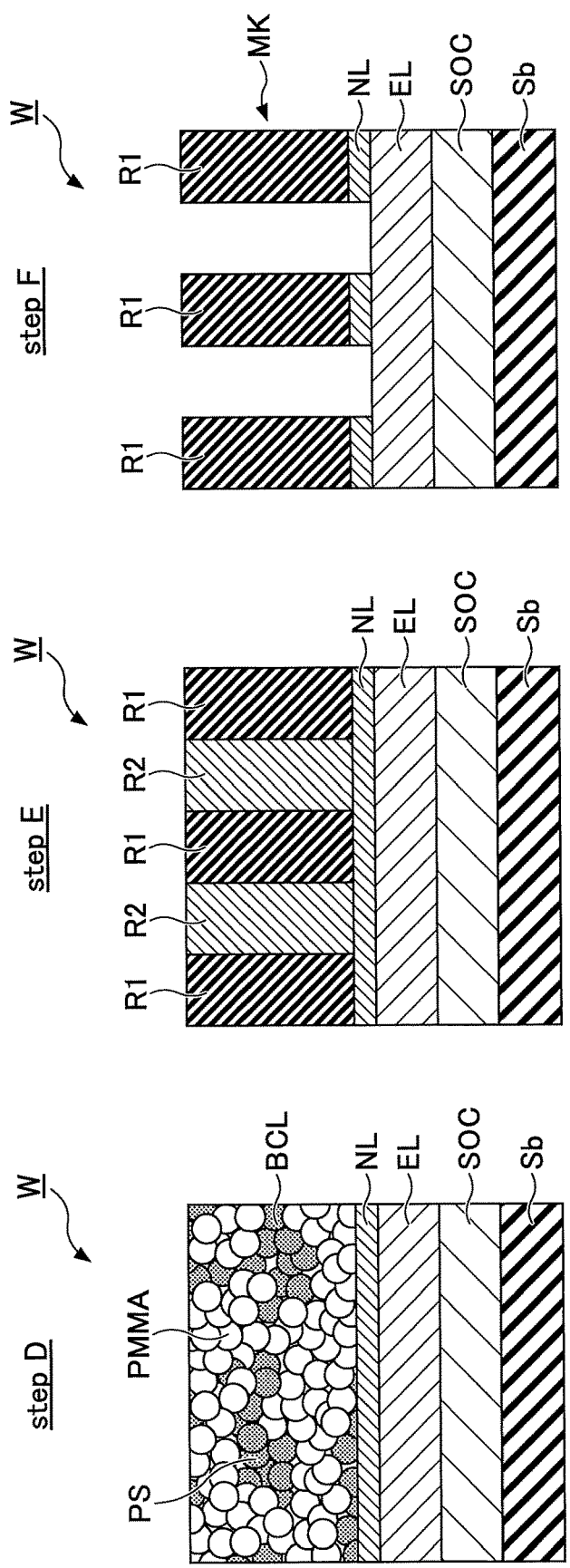
FIG. 4 is a drawing illustrating a cross section of a product produced at each step illustrated in FIG. 2.
Figure 5:
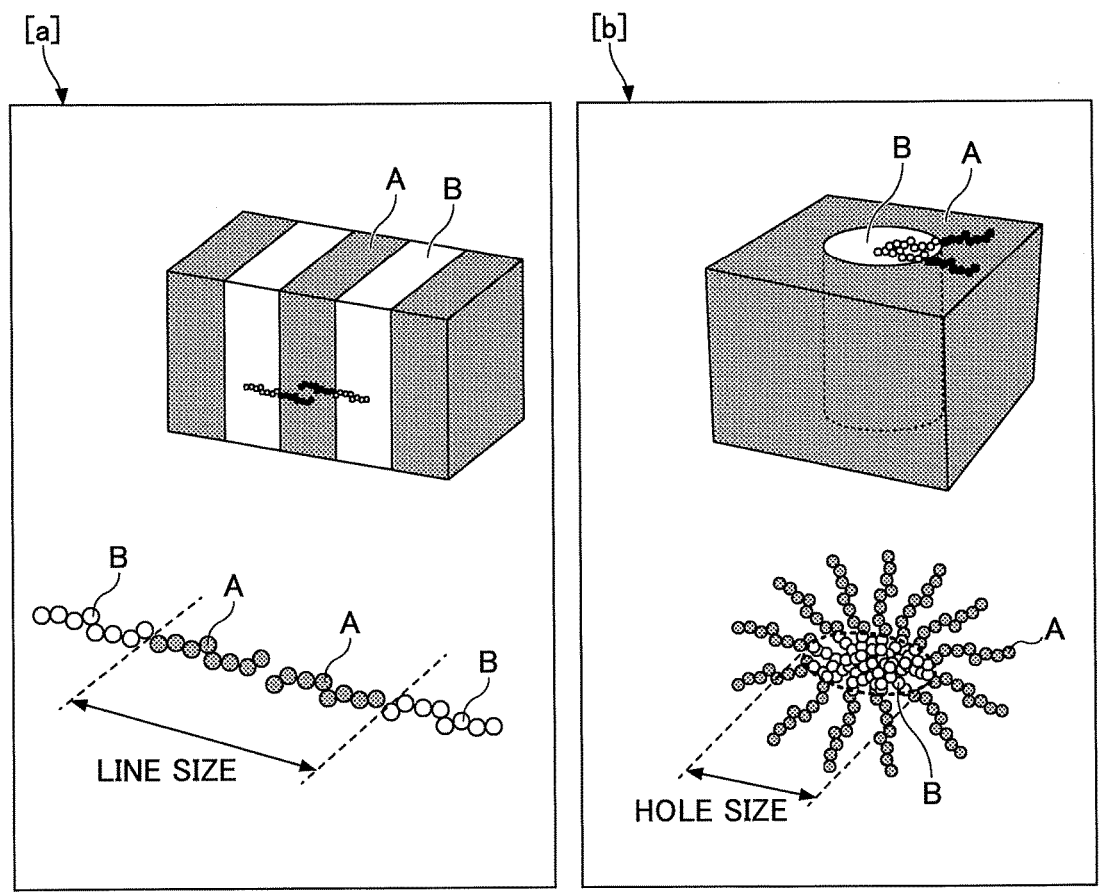
FIG. 5 is a drawing illustrating a self-assembly of a block copolymer.

FIG. 2 is a flowchart illustrating an etching method according to an embodiment of the present invention. FIG. 3, FIG. 4, and FIG. 5 are drawings illustrating cross sections, etc., of a product produced at each step illustrated in FIG. 2. As illustrated in FIG. 2, in an etching method according to an embodiment of the present invention, first, in step S10, an intermediate layer NL is formed on a surface of a wafer W which is an example of an object to be processed (process object, process target).

As illustrated in step A in FIG. 3, the wafer W includes a substrate Sb, a Spin On Carbon layer (SOC), and an etching target layer (a layer to be etched) EL. The substrate Sb includes, for example, silicon. The Spin On Carbon layer, SOC, is formed by spin coating by applying a carbon-containing material. The Spin On Carbon layer, SOC, and the etching target layer EL are formed on the substrate Sb in this order. The etching target layer EL is a layer that includes silicon. For example, the etching target layer EL may be a silicon-containing layer including a silicon-containing anti-reflection layer (Si-ARC), a silicon nitride (SiN) layer, a silicon oxide (SiOx) layer, a silicon oxynitride film (SiON), etc. The film thickness of the etching target layer EL may be 15 to 20 nm.

In step S10 in FIG. 2, as illustrated in step A in FIG. 3, an organic film OL is applied onto the etching target layer EL. The organic film OL is, for example, a block copolymer of polystyrene and polymethil methacrylate. Next, after application of the organic film OL, thermal processing (thermal process, thermal treatment) is applied to the wafer W. The appropriate temperature of the thermal processing depends on types of the organic films OL, and is typically about 200 to 300 degrees Celsius. For example, the temperature of the thermal processing is 250 degrees Celsius. As illustrated in step B in FIG. 3, according to the thermal processing, the organic film OL shrinks as a whole, and an intermediate layer NL and an altered layer RL are formed from the organic film OL. It should be noted that the altered layer RL is a layer in which the carbon in the organic film OL has been altered.

Next, as illustrated in step C in FIG. 3, the altered layer RL is chemically removed by development processing. With the above operations, only the intermediate layer NL is formed on the etching target layer EL. The surface of the intermediate layer NL has a neutral state between hydrophobicity and hydrophilicity. The polymer in the block copolymer layer has strong hydrophilicity when the polymer length is short, and has strong hydrophobicity when the polymer length is long. In this way, there are a type of polymer that has strong hydrophilicity, and a type of polymer that has strong hydrophobicity. Therefore, it is possible to obtain a desired shape of phase separation from a polymer by forming an intermediate layer NL whose surface has a neutral state.

Referring back to FIG. 2, in an etching method according to an embodiment of the present invention, next, in step S12, a block copolymer is applied onto the surface of the wafer W, that is, onto the surface of the intermediate layer NL. The block copolymer may be applied by using various methods including, for example, a spin coating method. With the above operations, as illustrated in step D in FIG. 4, a block copolymer layer BCL is formed on the surface of the intermediate layer NL.

The block copolymer is a self-assembled block copolymer, and includes a first polymer and a second polymer. In an embodiment of the present invention, the block copolymer is a polystyrene-block-polymethyl methacrylate (PS-b-PMMA). The PS-b-PMMA includes a polystyren (PS) as the first polymer and a polymethyl methacrylate (PMMA) as the second polymer.

Here, referring to FIG. 5, the block copolymer and the "self-assembled" will be described by taking the PS-b-PMMA as an example. The PS and the PMMA are polymers (macromolecules) whose molecule is 0.7 nm in diameter. After applying the block copolymer, which includes the PS and the PMMA that are immiscible with each other, onto the intermediate layer NL to form a block copolymer layer BCL, if thermal processing (annealing) is applied to the wafer W at a temperature equal to or greater than the normal temperature (25 degrees Celsius) and equal to or less than 300 degrees Celsius, then the phase separation is effectuated in the block copolymer layer BCL. Typically, the annealing is applied at the temperature range between 200 and 250 degrees Celsius. With respect to the above, when the thermal processing is applied at the temperature higher than 300 degrees Celsius, the phase separation is not effectuated in the block copolymer layer BCL, and the PS and the PMMA are arranged at random. Further, after the phase separation, even if the temperature is returned to a normal temperature, the block copolymer layer BCL still maintains the phase separation state.

When each of the polymer lengths is short, interaction (repulsive force) is weak and the hydrophilicity is strong. On the other hand, when each of the polymer lengths is long, interaction (repulsive force) is strong and the hydrophobicity is strong. By using the polymer characteristics described above, for example, as illustrated in FIG. 5[a] and in FIG. 5[b], phase separation structures of the PS and the PMMA can be produced. FIG. 5[a] illustrates a phase separation structure when a polymer A and a polymer B have substantially the same polymer length. In an example, the polymer A is a PS and the polymer B is a PMMA. In a case illustrated in FIG. 5[a], interactions of polymers are the same. Therefore, when the thermal processing at about 250 degrees Celsius is applied to the block copolymer layer BCL, the polymer A and the polymer B self-assemble to form line-shaped phase separation. In other words, the polymer A forms line-shaped first regions and the polymer B forms line-shaped second regions between the first regions. By using the phase separation structure described above, for example, it is possible to form a line-and-space (L/S) periodic pattern by removing the second regions including the polymer B. The periodic pattern described above can be used as a pattern for manufacturing a device such as a semiconductor device.

Further, FIG. 5[b] illustrates a case of a phase separation structure in which the polymer length of the polymer A is significantly different from the polymer length of the polymer B (the polymer length of the polymer A is longer than the polymer length of the polymer B). In the case illustrated in FIG. 5[b], the interaction (repulsive force) of the polymer A is strong and the interaction (repulsive force) of the polymer B is weak. When the thermal processing at about 250 degrees Celsius is applied to the block copolymer layer BCL described above, due to the strong interaction or the weak interaction of the polymers, the polymer A self-assembles into the outer side and the polymer B self-assembles into the inner side. In other words, the polymer B self-assembles into a second region with a cylindrical shape, and the polymer A self-assembles into a first region that surrounds the cylindrical region. By using the phase separation structure including the first region and the second region, for example, it is possible to form a periodic pattern of holes. The periodic pattern described above can also be used as a pattern for manufacturing a device such as a semiconductor device.

FIG. 2 is referred to again. Next, in step S14, a process for the phase separation of the block copolymer layer BCL is performed. For example, the phase separation is effectuated in the block copolymer layer BCL by heating the wafer W at the temperature between 200 and 300 degrees Celsius. With the above operations, as illustrated in step E in FIG. 4, first regions R1 including the first polymer and second regions R2 including the second polymer are formed in the block copolymer layer BCL. As described above, the first regions R1 and the second regions R2 may be a line-and-space pattern in which the regions are alternately arranged. Alternatively, the second region R2 may be a cylindrical region and the first region R1 may surround the cylindrical region R2.

Next, after step S14 is performed and before step S16 is performed, the wafer W is carried into the plasma processing apparatus 1 illustrated in FIG. 1.

In step S16, a mask MK is formed. The plasma processing apparatus 1 etches the second region R2 of the block copolymer layer BCL and the intermediate layer NL that is right under the second region R2.

When step S16 is performed in the plasma processing apparatus 1, specifically, a process gas is supplied to the inside of the processing chamber 10 from the gas supplying source 15, and the pressure in the processing chamber 10 is reduced to a set value by the exhaust apparatus 65. Further, high-frequency power HF for plasma generation is supplied to the susceptor 20 from the first high-frequency power source 32. It should be noted that, in step S16, if necessary, high-frequency power LF for a bias voltage from the second high-frequency power source 34 may be supplied to the susceptor 20. The process gas used in step S16 is a gas for etching the second region R2 including the second polymer and etching the intermediate layer NL right under the second region R2, and the process gas may include an $O_2$ (oxygen) gas. Further, the process gas may further include a rare gas such as an Ar gas, or an inert gas such as $N_2$ (nitrogen) gas.

In step S16, the etching is applied to the block copolymer layer BCL made of organic material according to active species of oxygen. The etching starts from the surface of the BLC. Here, the etching rate of the second region R2 composed of the second polymer is higher than the etching rate of the first region R1 composed of the first polymer. Therefore, in step S16, the second region R2 is selectively etched. Further, a part of the intermediate layer NL is etched that has been exposed by the removal of the second region R2. According to step S16, the wafer W will be in a state as illustrated in step F in FIG. 4. In other words, a mask MK is formed which includes the first region R1 and the intermediate layer NL right under the first region R1.

Next, as illustrated in FIG. 2, in step S18, a protective film is formed on the mask MK, and the etching target layer EL is etched. At this time, in step S18, in the plasma processing apparatus 1, plasma is generated under the process condition as shown below, and the wafer W is exposed to the plasma.

<Process Condition for Forming the Protective Film>
Pressure: 30 mT (3.9996 Pa)
Type of gas: a gas including $SF_6$, $C_4F_8$, and $H_2$
Power (high-frequency power HF): 200 W
Temperature (susceptor): 10 degrees Celsius In the case where step S18 is performed in the plasma processing apparatus 1, a process gas including a sulfur hexafluoride ($SF_6$) gas, an octafluorocyclobutane ($C_4F_8$) gas, and a hydrogen ($H_2$) gas is supplied to the inside of the processing chamber 10 from the gas supplying source 15, and the pressure in the processing chamber 10 is reduced to a set value by the exhaust apparatus 65. Further, high-frequency power HF is supplied to the susceptor 20 from the first high-frequency power source 32. Further, in step S18, if necessary, high-frequency power LF may be supplied to the susceptor 20 from the second high-frequency power source 34.

Figure 6:
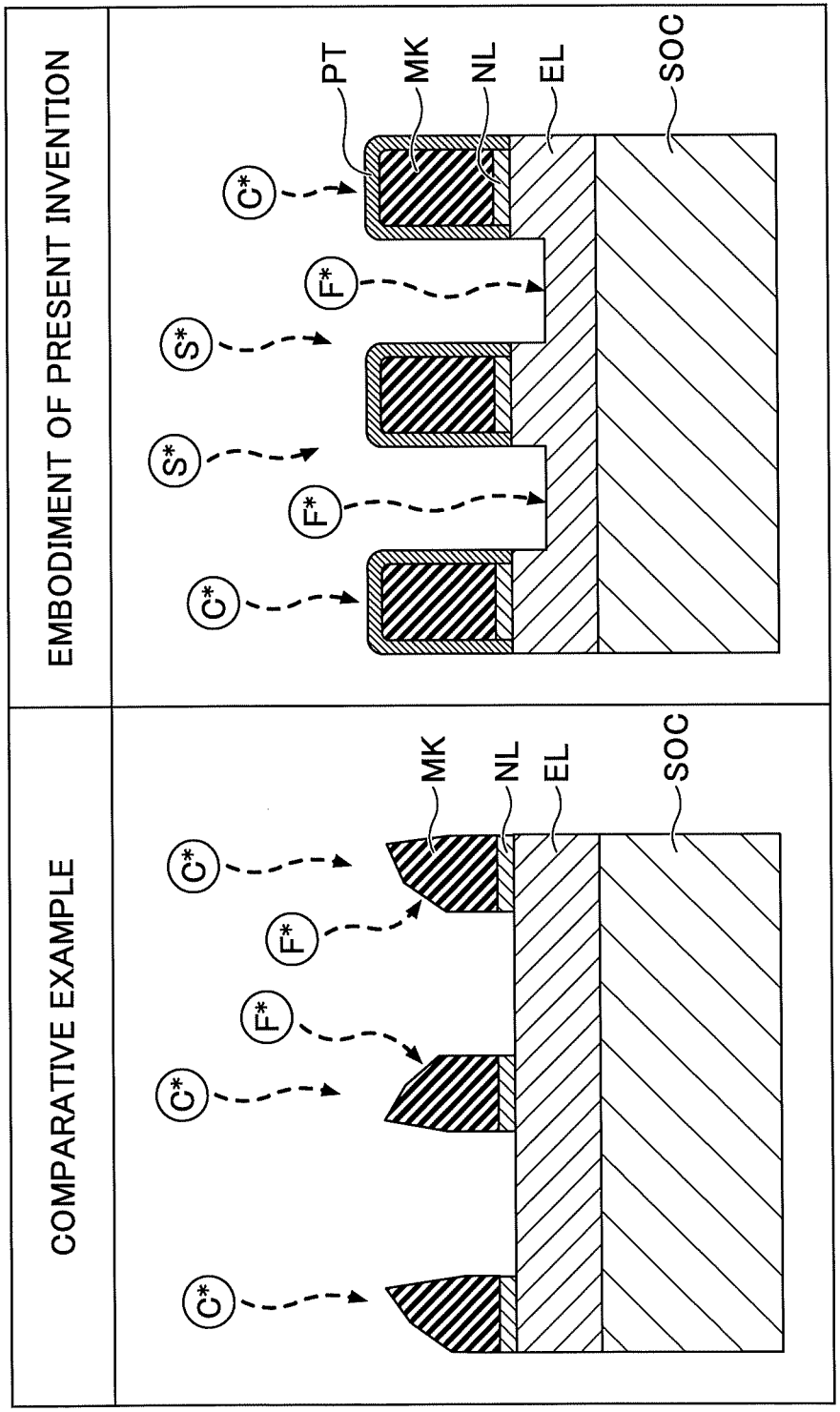
FIG. 6 is a drawing illustrating a protective film and an action of the protective film onto the etching according to an embodiment of the present invention.

In a comparative example illustrated in FIG. 6, the process gas includes carbon C and fluorine F, and does not include sulfur S. Therefore, in the plasma generated from the process gas, while active species of carbon (C*) and active species of fluorine (F*) are included, active species of sulfur (S*) are not included. In this case, a protective film is not formed on the mask MK made of polystyrene (PS) that has low plasma tolerance, and thus, the mask MK is cut down (is damaged) by the active species of fluorine (F*) and kinks of the mask pattern occur. Therefore, in the comparative example, it is difficult to expect improvement of the roughness of the etching-target layer EL.

With respect to the above, the plasma, that has been generated from a process gas including a SF6 gas, a C4F8 gas, and a $H_2$ gas, includes active species of sulfur (S*), active species of carbon (C*), and active species of fluorine (F*). Mainly the active species of sulfur (S*) and the active species of carbon (C*) in the plasma are accumulated (layered) on the mask MK. In other words, a protective film PT is a deposit including carbon C and sulfur S that are generated at the time of etching by the generated plasma.

With the above operations, the protective film PT including mainly sulfur S and carbon C is formed on the mask MK. The polystyrene (PS) included in the mask MK has low plasma tolerance. However, according to an etching method according to an embodiment of the present invention, the mask MK, that is made of polystyrene (PS) that has low plasma tolerance, is coated by the protective film PT. With the above arrangement, it is possible to prevent kinks of the mask MK.

Further, due to the fact that the plasma includes active species of fluorine (F*), the etching target layer EL that is exposed to the opening of the mask MK is etched. With the above arrangement, on the wafer W, the etching target layer EL is etched into the pattern of the mask MK. As described above, according to an etching method according to an embodiment of the present invention, it is possible to improve the roughness of the etching pattern. Further, it is possible to increase the selection ratio of the mask MK (mask selection ratio) with respect to the etching target layer EL.

As described in an embodiment of the present invention, it is preferable that a hydrogen gas be included in the process gas that is used in step S18. It is possible to improve the mask selection ratio of the mask MK with respect to the etching target layer EL by hardening the mask MK by forming the protective film PT, which is mainly made of sulfur S and carbon C, on the mask MK in a state in which the treatment is applied to the mask MK by the hydrogen plasma.

It should be noted that the process gas that is used in step S18 may only include carbon C, sulfur S, and fluorine F. For example, the process gas that is used in step S18 may include a fluorohydrocarbon gas such as a CHF3 gas in addition to or in place of a fluorocarbon gas such as a C4F8 gas.

Further, in place of the C4F8 gas in the process gas used in step S18, a Methane trifluoride (CHF3) gas, a difluoromethane ($CH_2F_2$) gas, monofluoromethane ($CH_3F$) gas, a methane ($CH_4$) gas, or a carbon tetrafluoride ($CF_4$) gas may be used.

Further, the process gas used in step S18 may further include an inert gas such as an Ar gas.

In an embodiment of the present invention, plasma is generated from the process gas including carbon C, sulfur S, and fluorine F, and the etching of the etching target layer EL is performed while the mask MK is being coated with the protective film PT according to an action of the plasma. According to an embodiment of the present invention, it is possible to prevent kinks of the pattern of the mask MK by forming the protective film PT including carbon C and sulfur S on the mask MK. For example, according to only a chemical action (wet) of the process gas including carbon C, sulfur S, and fluorine F alone, it is difficult to form the protective film PT including carbon C and sulfur S. The reason is as follows. According to only a chemical action of the process gas including carbon C, sulfur S, and fluorine F alone, it is difficult to control the thickness of the protective film PT, and thus, the film is formed, not only on top of the mask MK, but also on the etching target layer EL of the foundation, and it is difficult to improve the selection ratio. On the other hand, according to a plasma processing apparatus 1 according to an embodiment of the present invention, the protective film PT can be formed mainly on top of the mask MK by using a physical action of the plasma that is generated from the process gas.

Further, the etching of the etching target layer EL may be performed by using a process gas that includes a fluorinated gas and a hydrogen bromide (HBr) gas. However, the fluorinated gas and the hydrogen bromide gas are corrosive gases, and thus, when the fluorinated gas and the hydrogen bromide gas remain in the processing chamber 10 as a residual gas after the etching, the residual gas may react with $H_2O$ in the processing chamber 10 to corrode an object, or foreign matter may be generated. There, the time management after the etching is important. In other words, the time management is needed in such a way that the post-process can be started before the residual gas after the etching starts to react. With respect to the above, in an etching method according to an embodiment of the present invention, a process gas, in which a fluorine gas and a hydrogen bromide gas are included and with which the time management is needed for the etching process of step S18 and for the post-etching process, is not used.

It should be noted that the etching process according to an embodiment of the present invention is ended after the silicon-containing anti-reflection layer (Si-ARC) as the etching target layer EL is etched in step S18 as illustrated in FIG. 2. After the etching process according to an embodiment of the present invention, the Spin On Carbon layer SOC will be etched.

According to an etching method according to an embodiment of the present invention as described above, the protective film PT is formed on the mask MK at the time of the etching of the etching target layer EL. With the above arrangement, it is possible to protect the mask MK at the time of the etching of the etching target layer EL. In other words, by forming the protective film PT on the mask MK, it is possible to prevent occurrence of kinks of the mask MK at the time of etching in step S18. With the above arrangement, it is possible to prevent the kinks of the pattern, and to etch the etching target layer EL while maintaining the line width of the pattern. Therefore, according to an etching method according to an embodiment of the present invention, it is possible to improve the roughness of the etching pattern of the etching target layer EL, or the like.

Further, in this process, the hardening of the mask MK according to the hydrogen plasma may be performed. According to the hardening of the mask MK and to the forming of the protective film PT, it is possible to increase the selection ratio of the mask MK with respect to the etching target layer EL.

Further, according to an etching method according to an embodiment of the present invention, because the composition of the mask MK of the block copolymer layer that is enabled to be self-assembling is different from the composition of the ArF mask or EUV mask, the appropriate process condition for the mask MK of the block copolymer layer is used. According to the above, it is possible to decrease the roughness of the etching pattern of the etching target layer EL, etc., while enabling the micro-fabrication using the mask MK of the block copolymer layer, and while maintaining the height of the mask MK and the line width of the pattern.

[Effect Example]

Figure 7:
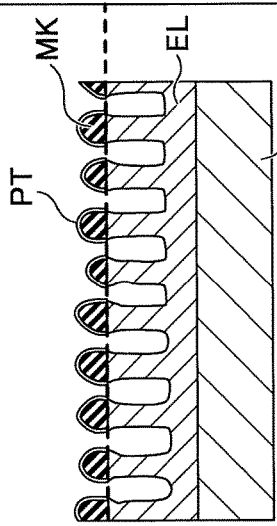
FIG. 7 is a drawing illustrating result examples when an etching method according to an embodiment of the present invention is performed and when an etching method according to a comparative example is performed.

Referring to FIG. 7, an example of a result of the etching of the etching target layer EL according to an etching method according to an embodiment of the present invention will be described. FIG. 7 is a drawing illustrating examples of results when an etching method according to an embodiment of the present invention is performed and when an etching method according to a comparative example is performed.

A line-and-space pattern according to a comparative example illustrated on the left side of FIG. 7 is an example of a result when the etching process is performed according to a process gas that includes a CF4 gas, CHF3 gas, an $O_2$ gas, a $N_2$ gas, and a He gas. Because sulfur S is not included in the process gas, the protective film PT including sulfur S and carbon C is not formed as illustrated in the comparative example in FIG. 6. As a result, in the comparative example, kinks of the line-and-space pattern occur. In this case, the LWR is 2.3, and the LER is 2.4.

With respect to the above, a line-and-space pattern according to an embodiment of the present invention illustrated on the right side of FIG. 7 is an example of a result when the etching process is performed according to a process gas that includes $SF_6$, $C_4F_8$, and $H_2$. Because sulfur S is included in the process gas, the protective film PT including sulfur S and carbon C is formed as illustrated in an embodiment of the present invention on the right side in FIG. 6. In this result, kinks of the line-and-space pattern do not occur. In this case, the LWR is 1.9, and the LER is 1.7. It can be understood that the roughness of the etching pattern of the target etching layer EL is significantly improved.

As described above, by supplying the process gas including $SF_6$, $C_4F_8$, and $H_2$ at the time of the etching of the etching target layer EL, and by forming the protective film PT on the mask MK, it is possible to prevent occurrence of kinks of the mask MK at the time of etching in step S18, and it is possible to etch the etching target layer EL while maintaining the line width of the pattern. Therefore, according to an etching method according to an embodiment of the present invention, it is possible to improve the roughness of the etching pattern of the etching target layer EL, or the like. Further, by coating the mask MK with the protective film PT, it is possible to increase the tolerance of the resist when the etching of the etching target layer EL is performed according to the fluorinated gas plasma. According to the above, it is possible to prevent the mask MK from being easily cut (damaged) at the time of etching, and it is possible to increase the selection ratio of the mask MK with respect to the etching target layer EL. In particular, in the case where the height of the mask MK is relatively low, it is preferable that an etching method according to an embodiment of the present invention be used.

As described above, etching methods according to one or more embodiments of the present invention have been described. However, the etching method is not limited to the above-described embodiments, and various variations and modifications can be made within the scope of the present invention. Matters described in the embodiments may be combined within the non-conflicting range.

For example, an etching method according to an embodiment of the present invention may be applied, not only to the capacitively coupled plasma (CCP) apparatus, but also to other plasma processing apparatuses. The other plasma processing apparatuses may be an inductively coupled plasma (ICP) apparatus, a plasma processing apparatus that uses a radial line slot antenna, a helicon wave plasma (HWP) apparatus, an electron cyclotron resonance plasma (ECR) apparatus, etc.

In the present specification, a semiconductor wafer W has been described as the etching target. However, the etching target may be various substrates used for an LCD (Liquid Crystal Display), an FPD (Flat Panel Display), etc., a photomask, a CD substrate, a printed board, etc.

The present application is based on and claims the benefit of priority of Japanese Priority Application No. 2015-230606 filed on Nov. 26, 2015, the entire contents of which are hereby incorporated herein by reference.

DESCRIPTION OF THE REFERENCE NUMERALS

10 Processing chamber
15 Gas supplying source
20 Susceptor (lower electrode)
25 Gas shower head (upper electrode)
32 First high-frequency power source
34 Second high-frequency power source
65 Exhaust apparatus
70 Variable DC power source
100 Control unit
106 Electro-static chuck
MK Mask
NL Intermediate layer
EL Etching target layer
SOC Spin On Carbon layer
BCL Block copolymer layer
PS Polystyrene
PMMA Polymethyl methacrylate

What is claimed is:

1. An etching method for etching a silicon-containing layer into a pattern of a mask that is formed by etching,
   from a block copolymer layer
      that includes a first polymer and a second polymer,
      that is layered on the silicon-containing layer of an object to be processed via an intermediate layer, and
      that is enabled to be self-assembled,
   a second region including the second polymer and the intermediate layer right under the second region, the etching method comprising:
   generating plasma by supplying a process gas including carbon, sulfur, and fluorine to the inside of a processing chamber of a plasma processing apparatus in which the object to be processed is provided; and
   forming a protective film on the mask and etching the silicon-containing layer according to the generated plasma.

2. The etching method according to claim 1, wherein the process gas includes at least one of a fluorocarbon gas and a hydrofluorocarbon gas.

3. The etching method according to claim 1, wherein the first polymer is a polystyrene, and the second polymer is a polymethyl methacrylate.

4. The etching method according to claim 1, wherein the protective film is a deposit including carbon and sulfur that are generated according to the etching by the generated plasma.

5. The etching method according to claim 1, wherein the process gas includes a hydrogen gas.

* * * * *